United States Patent [19]

McEntire et al.

[11] Patent Number: 4,547,304

[45] Date of Patent: Oct. 15, 1985

[54] NONFUMING SOLDER CLEANSING AND FUSING FLUIDS

[75] Inventors: Edward E. McEntire, Austin; Gordon H. Neville, Rosenberg; Edward C. Y. Nieh, Austin, all of Tex.

[73] Assignee: Texaco, Inc., White Plains, N.Y.

[21] Appl. No.: 645,589

[22] Filed: Aug. 30, 1984

[51] Int. Cl.$^4$ .................. C09K 13/00; C03C 23/00
[52] U.S. Cl. .................. 252/79.1; 134/2; 156/666; 156/903
[58] Field of Search .................. 252/79.1, 79.4; 156/903, 666; 134/2; 29/878, 879; 228/100.1, 100.2

[56] References Cited

U.S. PATENT DOCUMENTS

| 3,503,883 | 3/1970 | Ford et al. | 252/79.1 X |
| 4,510,018 | 4/1985 | McGowan | 156/666 |

*Primary Examiner*—William A. Powell
*Attorney, Agent, or Firm*—Jack H. Park; Kenneth R. Priem

[57] ABSTRACT

A solder fusing fluid for use in the high temperature cleaning of printed circuit boards and the like comprising an alkylene oxide adduct and a primary amine or an ethoxylate thereof which is water soluble and stable (i.e., non-volatile) at elevated temperatures.

8 Claims, No Drawings

NONFUMING SOLDER CLEANSING AND FUSING FLUIDS

BACKGROUND OF THE INVENTION

1. Technical Field of the Invention

This invention relates to nonfuming, cleansing and solder fusing fluids. In soldering processes, such as those used in the manufacture of printed circuit boards, fusing fluids are used to melt and/or remelt the solder at the comparatively high temperatures used during the process. In certain processes, such as infra-red solder reflow processes, the fusing fluids also function as protective coverings for the metal surfaces. This is important, because during such processes, through handling, air exposure, etc., the electrically conductive metals present on the semicompleted circuit boards may become contaminated due to corrosion, etc. If the contaminants are not removed, their presence can lead to excess conductivity between metal strips (e.g., across intended insulators) in poor circuit board appearance and in poor adhesion of the solder.

Past results have not been entirely satisfactory, particularly when it is desired to use the fusing fluid as a protective medium to prevent contamination of the electrically conductive metal in the circuit board during the manufacturing process.

It has been discovered, in accordance with the present invention, that the foregoing and related problems can be overcome through the provision of a cleansing solder fusing fluid containing a cleansing amount of a high temperature stable primary amine or an ethoxylate thereof.

2. Prior Art

It is known to utilize amines such as ethylene diamine, monoethanolamine, diethanolamine, triethanolamine, and equivalent low molecular weight amines in the formulation of solder fluxes as shown, for example, on page 31 of the text "Solders and Soldering", H. M. Manko, McGraw-Hill, New York, 1979. However, it has been discovered in accordance with the present invention that when it is attempted to use amines such as those disclosed by Manko as components of cleansing and solder fusing fluids for high temperature automated solder manufacturing processes, such as those used in the manufacture of printing circuits, that unsatisfactory results are obtained. For example, when it is attempted to use amines of this nature in soldering processes operated at temperatures of more than about 100° C. such as temperatures of about 110° to about 250° C., excessive fuming will occur.

SUMMARY OF THE INVENTION

The present invention is directed to solder fusing fluids containing a cleansing amount of a high temperature stable primary amine or primary amine ethoxylate. More particularly, this invention relates to a solder fusing fluid comprising an inhibited hydroxy terminated adduct of a hydroxy-containing initiator such as an alcohol, a phenol, a glycol, a triol, etc. alkoxylated with thylene oxide or a mixture of ethylene oxide and propylene oxide and having a molecular weight of at least about 400 to which has been added a cleansing amount (e.g., 1 to 100 wt.% of the base fluid) of a temperature stable primary amine or primary amine ethoxylate.

The primary amines and primary amine ethoxylates to be used in accordance with the present invention are those that are compatible with the base fluid (i.e., soluble therein) that are effective for cleaning electrical conductive metal surfaces (e.g., copper) at elevated temperatures such as temperatures within the range of about 100° to about 250° C. without fuming. The amines or amine ethoxylates should also be water soluble so that they can be removed from the surface being soldered, as desired, by a simple water washing step.

DETAILED DESCRIPTION

The principle components of the present invention are a solder fusing fluid and an amine cleansing agent.

THE SOLDER FUSING FLUID

The preferred solder fusing fluids to be used in accordance with the present invention are those prepared by reacting ethylene oxide or a mixture of ethylene oxide and propylene oxide with an initiator in order to form an adduct, such as one having a molecular weight of at least about 400, which is thermally stable and nonvolatile at temperatures within the range of about 100° to about 250° C. The solder fusing oil should be water soluble.

Examples of initiators that may be used in the preparation of solder fusing fluids include compounds such as alcohol (e.g., alcohols containing 1 to 20 carbon atoms) such as methanol, ethanol, propanol, isopropanol, butanol, hexanol, decanol, hexadecanol, dodecanol, etc.; phenols such as phenol or phenols containing 1 or more alkyl groups such as methylphenol, dimethylphenol, propylphenol, hexylphenol, nonylphenol, dodecylphenol, etc.; glycols such as ethylene glycol, diethylene glycol, propylene glycol, etc.; triols such as glycerol, trimethylol propane, etc.

The initiator is reacted under alkoxylation conditions with an alkylene oxide component containing from 100 to about 25 wt.% of ethylene oxide and, correspondingly, from 0 to about 75 wt.% of propylene oxide, such that the final adduct is water soluble.

It is conventional practice to include oxidation inhibitors in the solder fusing fluid such as alkylphenols, arylamines, diarylamines, etc. The inhibitor will normally constitute only a minor amount of the composition, such as an amount within the range of about 0.1 to about 3 wt.%.

THE THERMALLY STABLE AMINE CLEANSING AGENT

The primary amines to be used in accordance with the present invention are those which are soluble in the fusing oil, thermally stable (i.e., essentially nonfuming) at temperatures within the range of about 100° to about 250° C. Generally speaking, such primary amines will have a molecular weight of at least about 400 and a boiling point of at least about 300° C.

As an example, a polyethylenepolyamine may be used such as one having the following formula:

Wherein n has a value of about 2 to about 200.

As another example, the amine may be a polyoxypropylene diamine having the formula:

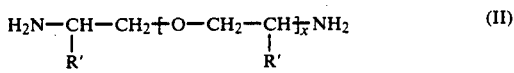

Wherein: R' independently represents hydrogen or methyl.

Examples of polyoxylalkylenediamines of this formula which are useful in accordance with the present invention are those wherein x has a value of 3 to about 40 such as those compounds known as Jeffamine D (Formula II) and Jeffamine T (Formula V) series available from Texaco Chemical Company.

Another exaple of a suitable primary amine to use in accordance with the present invention is a polyoxyalkyleneamine urea condensate such as one having the following formula:

$$H_2NCH(CH_3)CH_2{-}OCH_2CH(CH_3){-}_nNHCONH{-}CH(CH_3)CHCH_2O{-}_nCH_2CH(CH_3)NH_2 \quad (III)$$

Examples of suitable products having this formula are those listed in the following table:

TABLE I

| JEFFAMINE DU Product | JEFFAMINE Precursor | Moles Precursor | Moles Urea | Approx. MW |
|---|---|---|---|---|
| 700 | D-400 | 2 | 1 | 820 |
| 1700 | D-400 | 4 | 3 | 1675 |
| 3000 | D-2000 | 2 | 1 | 3000 |

Another example of a suitable amine to be used in accordance with the present invention is a polyoxyethylenediamine such as one having the formula:

(IV)

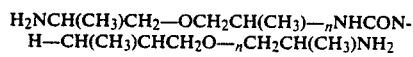

Examples of suitable polyoxyethylenediamines having this formula are given in the following table:

TABLE II

| Product | Approximate Value | |
| | b | a + c |
|---|---|---|
| JEFFAMINE ED-600 | 8.5 | 2.5 |
| JEFFAMINE ED-900 | 15.5 | 2.5 |
| JEFFAMINE ED-2001 | 40.5 | 2.5 |
| JEFFAMINE ED-4000 | 86.0 | 2.5 |

Still another example of an amine to be used in accordance with the present invention is a polyoxypropylenetriamine having the formula:

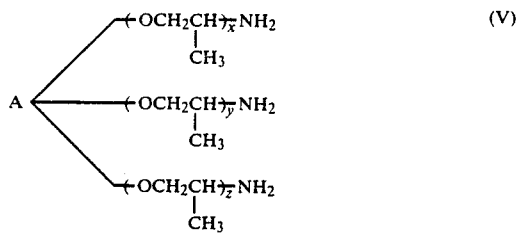

(V)

Examples of suitable products having this formula include:

TABLE III

| Product | Initiator (A) | Approx. MW | Moles PO |
|---|---|---|---|
| T-403 | TMP | 400 | 5–6 |
| T-5000 | Glycerine | 5000 | 85 |

Another series of amines that may be used in accordance with the present invention are those having the following formula:

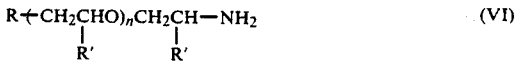

Wherein: R' independently represents hydrogen or methyl.

Examples of such products include the following:

TABLE IV

| Amine | Initiator | PO/EO Ratio |
|---|---|---|
| M-300 | $nC_{10}{-}C_{12}O{-}$ | 2/0 |
| M-360 | $nC_4H_9CH_2CH_2O{-}$ | ⅔ |
| M-600 | $CH_3OCH_2CH_2O{-}$ | 9/0 |
| M-1000 | $CH_2OCH_2CH_2O{-}$ | 3/18 |
| M-2005 | $CH_3OCH_2CH_2O{-}$ | 32/2 |
| M-2070 | $CH_3OCH_2CH_2O{-}$ | 10/31 |

An example of an ethoxylated primary amine that may be used in accordance with the present invention is one having the following formula:

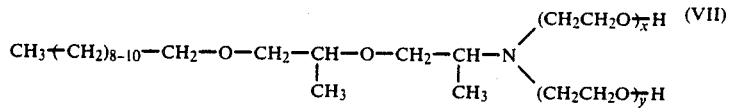

such as one of the following products as listed in the following table:

TABLE V

| Surfactant Product | x + y |
|---|---|
| M-302 | 2 |
| M-305 | 5 |
| M-310 | 10 |
| M-315 | 15 |
| M-320 | 20 |

The amount of the thermally stable amine of the present invention to be mixed with the fusing oil should be an amount effective to clean the metal surfaces which are being soldered. Normally, from about 3 to about 10 wt.% of the thermally stable amine, based on the fusing oil, will be adequate. However, when desired, and where appropriate, larger amounts may be used without adverse effect. In fact, the total fusing oil may be replaced with the amine. In like manner, smaller amounts may be used in appropriate instances, provided that the amount of amine used is adequate to provide for cleansing at the temperature involved.

SPECIFIC EXAMPLES

Example 1

A solder fusing fluid was prepared by combining 980 g of the 9.5 mole ethoxylate of nonylphenol (Surfonic N-95 supplied by Texaco Chemical Company) and 20 g of a proprietary inhibitor (Texaco Chemical Company) known as Y2. To a sample of the fusing fluid was added Experimental Surfactant Jeffmine M-310 (to make 5%) which is an amine with the following structure:

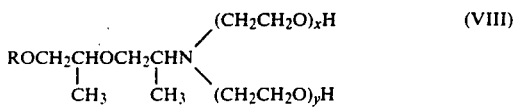

where R is a mixture of 10 and 12 carbon alkyl groups and where $x+y=10$. The viscosity of the amine containing fluid was 326 cs at 20° C.

A 60 g sample of this fluid was placed in a glass 100 ml beaker with ca. 10 g of 63/37 solder (ASTM Class A). The beaker and contents were heated on a hot plate to 224° C. A tarnished, oxidized copper strip 1 inch × 4 inches × 0.02 inch was then introduced into the hot fluid for 5 minutes. The strip was then removed and washed in water. The portion of the strip which had been immersed in the fluid appeared cleaner and brighter than a similar strip immersed in an identical fluid not containing the Experimental Surfactant M-310.

The fluid after remaining at ca. 200° for 1.3 hours was cooled to 120° C. Another tarnished copper strip was introduced into the fluid and remained in the fluid at 120° C. for 40 minutes. After washing, again the previously immersed portion of the copper strip appeared cleaner than a similar strip which had been immersed in fluid not containing the amine.

At no point during the experiment was any fuming due to the added amine detected. The final viscosity of the amine containing heated fluid was 325 cs at 20° C., essentially unchanged. The total amine content as determined by titration with acid was also essentially unchanged, 0.07 meq/g versus 0.08 meq/g for the unheated fluid.

EXAMPLE 2

Comparative Example

A sample of the solder fusing fluid from Example 1 containing only Surfonic N-95 and the Y2 inhibitor (N-95-Y2), 57 g was combined with 3 g N-(2-hydroxyethyl)piperazine. This fluid was heated on a hot plate as before, but at ca. 150° C. the fluid was fuming. At 180° C. the fluid was fuming excessively with dense, white smoke and the experiment was aborted. The base fluid (N-95-Y2) showed only a trace of fuming even at temperatures as high as 220° C. Thus, the hydroxyethyl piperazine was not suitable as a metal cleaner under these conditions due to the dense fuming and volatility of the amine.

EXAMPLE 3

A 60 g sample of N-95-Y2 containing 5% by weight of Jeffamine ® D-230 (aminated polypropylene glycol of molecular weight ca. 230 available from Texaco Chemical Company) was subjected to heating at 100°-140° C. A tarnished copper strip was cleaned relative to a strip immersed in N-95-Y2 under similar conditions (40 minutes immersion time, water wash). At more evelated temperatures (200° C.) the Jeffamine D-230 fluid began to fume escessively and the experiment was aborted. Thus, the Jeffamine D-230 was useful at the lower temperature, but could not be used at elevated temperatures.

EXAMPLES 4–7

Fusing fluids containing three other amines were prepared and heated as above (Example 1). The results are summarized in the table below:

TABLE VI

| | | N-95-Y2 Based Fluids | | | |
|---|---|---|---|---|---|
| Example | Additive | Wt. % Additive | Temperature °C. | Immersion Time | Results |
| 4 | Thanol SF-265* | 5 | 110–112 | 15 min. | No cleaning observed |
| 5 | Jeffamine M-300[1] | 10 | 118–120 | 15 min. | Brighter than blank |
| 6 | Jeffamine ED-600[2] | 10 | 118–120 | 15 min. | Brighter than blank |
| 7 | Jeffamine D-400[3] | 5 | 118–120 | 15 min. | Slightly brighter than blank |

*Amine containing polyol of hydroxyl number 635, amine content 6.35 meg/g available from Texaco Chemical Co.
[1]Structure ROCH$_2$CHOCH$_2$CHNH$_2$ where R defined in Example 1.
                |      |
                CH$_3$  CH$_3$
available from Texaco Chemical Company.
[2]Structure H$_2$NCH(CH$_3$)CH$_2$(OCHCH$_3$)$_a$(OCH$_2$CH$_2$)$_b$(OCH$_2$CH)$_c$NH$_2$ where a + c = 3.5, b = 13.5, available from Texaco Chemical Co.
[3]Aminated polypropylene glycol, molecular weight ca. 400, available from Texaco Chemical Co.

At ca. 200° C. all of the materials (4–7) rapidly (5 min.) cleaned and brightened the tarnished copper strips relative to the blank (N-95-Y2). The copper which was coated with solder (on the bottom of each strip) also emerged bright. Thus, the solder in the high temperature portion of the test was not oxidized during the tests.

It will be understood that the foregoing examples are given by way of illustration only and not by way of limitation and that the scope of the present invention is defined solely by the appended claims.

What is claimed is:

1. A composition comprising a solder fusing fluid having incorporated therein a cleansing amount of a thermally stable primary amine or ethoxylate of a primary amine.

2. A composition as in claim 1 wherein the solder fusing fluid is a hydroxy terminated alkylene oxide adduct of an initiator component and an alkylene oxide component, said initiator component being selected from the class consisting of $C_1$–$C_{20}$ alcohols, phenol, phenol substituted with alkyl groups containing 1 to 12 carbon atoms, glycols, triols, etc.; said alkylene oxide adduct comprising from about 100 to about 25 wt.% of ethylene oxide and, correspondingly, from 0 to about 25 wt.% of propylene oxide.

3. A composition as in claim 1 wherein the solder fusing fluid is a hydroxy terminated alkylene oxide adduct of an initiator component and an alkylene oxide component, said initiator component being selected from the class consisting of $C_1$–$C_{20}$ alcohols, phenol, phenol substituted with alkyl groups containing 1 to 12 carbon atoms, glycols, triols, etc.; said alkylene oxide adduct comprising from about 100 to about 25 wt.% of ethylene oxide and, correspondingly, from 0 to about 75 wt.% of propylene oxide and wherein said thermally stable amine is a primary amine or an ethoxylate of a primary amine which is compatible with said fusing oil, thermally stable and nonfuming in the presence of said fusing oil at temperatures within the range of about 100° to about 300° C.

4. A composition as in claim 3 wherein the thermally stable cleansing amine is present in the composition in an amount within the range of about 3 to about 100 wt.%, based on the fusing oil.

5. A composition as in claim 4 wherein the amine is an amine having the formula:

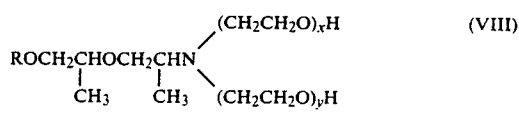
(VIII)

wherein R is an alkyl group containing from 10 to 12 carbon atoms, and wherein $x+y=10$, and wherein the solder fusing fluid is an ethoxylated nonylphenol containing from about 5 to about 15 moles of ethylene oxide per mole of nonylphenol.

6. A composition as in claim 4 wherein the amine is an amine having the formula:

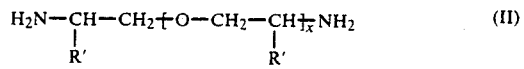
(II)

wherein x has a value within the range of about 2 to about 3 and wherein R′ independently represents hydrogen or methyl.

7. A composition as in claim 4 wherein the amine is a compound having the formula:

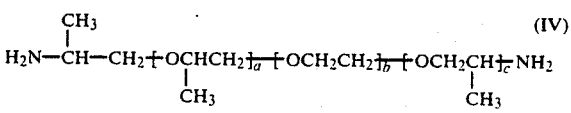
(IV)

wherein a+c equals an average of about 2.5 and wherein b has a value of about 8.5.

8. A composition as in claim 4 wherein the amine has the formula:

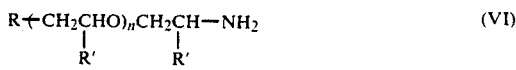
(VI)

wherein R′ is independently hydrogen or methyl, wherein R is an alkoxy radical containing from 10 to 12 carbon atoms and wherein n has a value of about 2.

* * * * *